United States Patent [19]
Klein et al.

[11] Patent Number: 5,646,448
[45] Date of Patent: Jul. 8, 1997

[54] COPPER PELLET FOR REDUCING ELECTROMIGRATION EFFECTS ASSOCIATED WITH A CONDUCTIVE VIA IN A SEMICONDUCTOR DEVICE

[75] Inventors: Richard K. Klein, Mountain View; Darrell Erb, Los Altos; Steven Avanzino; Robin Cheung, both of Cupertino; Scott Luning, Menlo Park; Bryan Tracy, Oakland; Subhash Gupta, San Jose; Ming-Ren Lin, Cupertino, all of Calif.

[73] Assignee: Advanced Micro Devices, Sunnyvale, Calif.

[21] Appl. No.: 699,821

[22] Filed: Aug. 19, 1996

Related U.S. Application Data

[63] Continuation of Ser. No. 461,428, Jun. 5, 1995, abandoned.

[51] Int. Cl.$^6$ ................. H01L 23/522; H01L 23/532
[52] U.S. Cl. .................. 257/751; 257/752; 257/762; 257/763; 257/764; 257/765; 257/915
[58] Field of Search ............................ 257/751, 752, 257/758, 760, 763, 764, 762, 765, 915, 771

[56] References Cited

U.S. PATENT DOCUMENTS

| | | | |
|---|---|---|---|
| 5,243,222 | 9/1993 | Harper et al. | 257/762 |
| 5,403,781 | 4/1995 | Matsumoto et al. | 437/195 |
| 5,442,235 | 8/1995 | Parrillo et al. | 257/767 |
| 5,459,353 | 10/1995 | Kanazawa | 257/759 |

*Primary Examiner*—Peter Toby Brown
*Attorney, Agent, or Firm*—Foley & Lardner

[57] ABSTRACT

A multilayer semiconductor structure includes a conductive via. The conductive via includes a pellet of metal having a high resistance to electromigration. The pellet is made from a conformal layer of copper or gold deposited over the via to form a copper or gold reservoir or contact located in the via. A barrier layer is provided between the reservoir and an insulating layer to prevent the pellet from diffusing into the insulating layer. The pellet can be formed by selective deposition or by etching a conformal layer. The conformal layer can be deposited by sputtering, collimated sputtering, chemical vapor deposition (CVD), dipping, evaporating, or by other means. The barrier layer and pellet may be etched by anisotropic dry etching, plasma-assisted etching, or other layer removal techniques.

16 Claims, 5 Drawing Sheets

COPPER PELLET FOR REDUCING ELECTROMIGRATION EFFECTS ASSOCIATED WITH A CONDUCTIVE VIA IN A SEMICONDUCTOR DEVICE

This is a continuation of application Ser. No. 08/461,428 filed Jun. 5, 1995 now abandoned.

CROSS-REFERENCE TO RELATED APPLICATIONS

This application is related to pending U.S. patent application Ser. No. 08/464,305, entitled "Copper Reservoir for Reducing Electromigration Effects Associated with a Conductive Via in a Semiconductor Device", filed on an even date herewith; and abandoned U.S. patent application Ser. No. 08/462,144, entitled "Multilayer Conductive Line for Reducing Electromigration Effects Associated with a Conductive Via in a Semiconductor Device", filed on an even date herewith.

FIELD OF THE INVENTION

The present invention relates to an integrated circuit semiconductor device, and more particularly to a method and apparatus for reducing electromigration failures on a conductive line and at a conductive via in a semiconductor device.

BACKGROUND OF THE INVENTION

In general, as semiconductor devices or integrated circuits have become smaller, the corresponding current densities across the metal conductors in the devices have increased. Metal conductors typically have an upper current density limit imposed by the phenomenon of electromigration. For example, aluminum conductors experience electromigration problems at current densities of approximately $10^5$ amperes per square centimeter ($A/cm^2$).

Electromigration refers to the transport of mass in metals due to electric current. Electromigration is caused by the transfer of momentum from the electrons associated with the electric current to the positive metal ions. When a significant amount of current passes through thin metal conductors in semiconductor devices or integrated circuits, the metal ions associated with the thin metal conductors are transported and tend to accumulate in some regions and be removed from other regions. The accumulation or pileup of the metal ions can short circuit adjacent conductors in the device. The removal of metal ions in other regions may create voids which result in an open circuit. Short circuits and open circuits caused by electromigration often result in device failure.

Electromigration is a particular problem in multilayer semiconductor devices which include conductive vias or contacts connecting at least two conducting lines or paths. Conductive lines in semiconductor devices are generally thin layers (e.g., approximately 4,000 Angstroms (Å) thick) of aluminum (Al) or an alloy of Al. The excessive current density associated with the conductive vias cause electromigration problems on the conductive line. The area proximate the conductive via commonly experiences excessive current densities because current from two or more conductive paths generally merges at the conductive via. Generally, a void is formed on one side of the via and a pile-up is formed on the other side of the via in accordance with the direction of current flow through the via.

Typically, the Al conductive lines are doped with copper (Cu) (e.g., alloying the aluminum with 0.5%–2% of Cu). Al conductive lines are generally doped with less than 2% Cu because higher concentrations of Cu make the lines difficult to dry etch. The Cu in the Al conductive line makes the conductive line less susceptible to the harmful effects of electromigration due to the higher electromigration resistance of the Cu. However, even conductive lines containing approximately 1% Cu or more are susceptible to electromigration as semiconductor devices become smaller and consequently, current densities increase.

Thus, there is a need for a multilayer semiconductor structure which is less susceptible to the harmful effects of electromigration. There is also a need for a conductive via which does not create electromigration problems on the conductive line. There is further a need for semiconductor structure having lightly doped (less than 2% Cu) Al conductive line which is less susceptible to electromigration problems proximate the via.

SUMMARY OF THE INVENTION

The present invention relates to an improved multilayer semiconductor structure. The semiconductor structure includes a barrier layer formed over a conductive line and an insulating layer formed over the barrier layer. The barrier layer prevents diffusion and the insulating layer has a via extending through the insulating layer and the barrier layer. The barrier layer has a top side adjacent the insulating layer and a bottom side adjacent the conductive line. The semiconductor structure includes an improvement comprising a pellet of metal having a high resistance to electromigration situated within the via. The pellet has a top side located beneath the top side of the barrier layer. The pellet advantageously reduces electromigration failures associated with the conductive line.

The present invention further relates to a method of fabricating a semiconductor structure including a conductive line and an insulating layer formed over the conductive line. The insulating layer has a top side, a bottom side, and a via. The via has an interior wall including a first section extending from the top side of the insulating layer through the insulating layer to the bottom side of the insulating layer, and a second section extending from the first section to the conductive line. The semiconductor structure is less susceptible to electromigration failures associated with the via. The method includes the steps of depositing a conformal layer of metal having a high resistivity to electromigration over the via, the conformal layer being coupled to the conductive line, thereby covering the interior wall of the via, and removing the conformal layer from the top side of the insulating layer and from the first section of the interior wall, thereby forming a pellet within the via, the pellet being in contact with the conductive layer.

The present invention even further relates to a method of reducing electromigration failures associated with a via in a semiconductor structure. The semiconductor structure includes a conductive line and an insulating layer formed over the conductive line. The insulating layer has a top side and a bottom side. The method includes the steps of forming the via in the semiconductor structure, the via extending from the top side of the insulating layer to the conductive line, and fabricating a pellet of metal having a high resistance to electromigration, the metal pellet being in contact with the conductive line and isolated from the insulating layer.

The present invention further still relates to a semiconductor structure including a conductive line, an insulating layer, a conductive via and a pellet of metal. The insulating layer is situated above the conducting line and has a top side and a bottom side. The conductive via extends from the top side through the bottom side to the conductive line. The pellet of metal has a high resistance to electromigration. The pellet is situated within the via and coupled to the conductive line. The pellet has a top side situated beneath the bottom side of the insulating layer. The pellet reduces electromigration failures associated with the conductive line.

The present invention additionally relates to a conductive via for a multilayer semiconductor device. The semiconductor device is less susceptible to electromigration failures associated with the conductive via. The conductive via is fabricated by the steps of forming the via in the semiconductor structure, the via extending from the top side of an insulating layer through the bottom side of the insulating layer to a conductive line, and forming a metal pellet having a high resistance to electromigration, the metal pellet being in physical contact with the conductive line and physically isolated from the insulating layer.

In one aspect of the present invention, a pellet of metal having a high resistance to electromigration is provided in the conductive via. The pellet is located beneath the oxide or insulating layer to prevent the pellet from diffusing into the insulating layer. The pellet is preferably a copper (Cu), or gold (Au) contact at the bottom of the via. Alternatively, the pellet can be an alloy or compound containing one or more of the above listed metals.

In another aspect of the present invention, the pellet is made from a conformal Cu layer deposited in the via. The Cu layer is deposited by a sputter technique or chemical vapor deposition (CVD) and directionally or anisotropically etched at a 60 degree angle to form the pellet at the bottom of the via.

The present invention advantageously reduces electromigration due to high current densities associated with the conductive via. The pellet of metal having a high electromigration resistance supplies metal ions or atoms to the critical region of the conductive line beneath the contact or via. The supply of metal ions prevents voids from forming on the conductive line. The metal such as Cu advantageously provides an "infinite" supply of atoms which migrate in the conductive line before other metals in the conductive line. Since the Cu atoms migrate first, the Al atoms or other metal atoms in the conductive line do not migrate, and hence, voids are prevented from forming. Thus, the selective supply or source of metal such as Cu near the via reduces problems associated with electromigration and yet allows the conductive line to be made from an alloy which is easily etched.

BRIEF DESCRIPTION OF THE DRAWINGS

Preferred embodiments of the invention will hereinafter be described in conjunction with the appended drawings, wherein like numerals denote like elements, and.

DETAILED DESCRIPTION OF PREFERRED EXEMPLARY EMBODIMENTS

Figure 1:
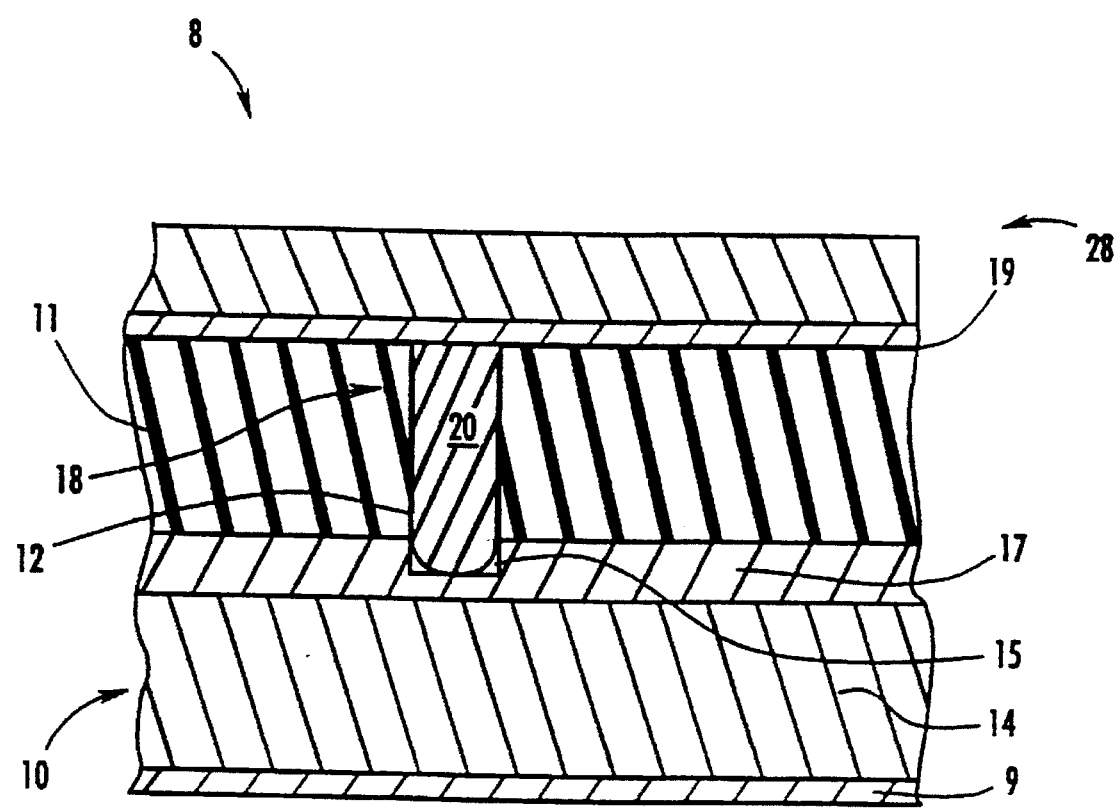
FIG. 1 is a cross-sectional view of a prior art multilayer semiconductor device including a conductive via.

Referring to FIG. 1, a prior art semiconductor device or structure 8 includes a conductive line 8, a conductive line 10, a barrier layer 17, an insulating layer 11, and a conductive via 18. Conductive line 10 is overcoated with barrier layer 17, which is overcoated with insulating layer 11. Insulating layer 11 includes a hole or via 12 extending from a top surface 19 of insulating layer 11 to a bottom 15. Bottom 15 is in contact with barrier layer 17 between insulating layer 11 and conducting line 10. A tungsten plug 20 fills via 12 to form a conductive via 18. Conductive line 8 is similar to conductive line 10 and situated above insulating layer 11.

Conductive line 10 includes a 250 angstrom (Å) thick bottom layer 9 of titanium (Ti) and a 4000 Å thick aluminum (Al) layer 14. Alternatively, conductive line 10 can be fabricated without a seed layer such as layer 9. Layer 9 serves as a seed layer for the deposition of layer 14. Layer 14 is doped with 1% copper (Cu) to make layer 14 more electromigration resistant. Preferably, the level of Cu in layer 14 is chosen so that conductive line 10 may be easily processed and etched (e.g., less than 2%). Barrier layer 17 serves as an etch stop for subsequent reactive ion etching (RIE) and a nucleating material. Barrier layer 17 is preferably a 1,100 Å thick layer of titanium nitride (TiN) and is deposited on top of layer 14. Layer 17 is typically conductive.

Insulating layer 11 is preferably a 4,000 Å to 6,000 Å thick layer of PECVD TEOS oxide or $SiH_4$ based PECVD oxide which is blanket deposited on barrier layer 17. Via 12 is typically dry etched in insulating layer 11 from top surface 19 to bottom 15 in barrier layer 17. A plug 20 is formed in via 12 extending from top surface 19 to bottom 15. Conductive line 28 is applied to top surface 19 of structure 8 and is electrically coupled to conductive line 10 through plug 20 of conductive via 18.

The fabrication of semiconductor structure 8 is described in more detail as follows. After layers 17, 14, and 9 are deposited by a physical vapor deposition (PVD), sputtering deposition, collimated sputtering deposition, dipping, evaporating, or other application technique, conductive line 10 is etched by a photoresist and plasma etching process to form a conductive pattern. Alternatively, the conductive pattern for conductive line 10 can be formed by a wet etching, or other fabrication process. After the conductive pattern is formed, a 2.0 micron or greater layer (not shown) of PECVD TEOS or other insulating material is deposited on top of conductive line 10 to form insulating layer 11.

The 2.0 micron layer is chemical mechanical polished (CMP) back approximately 1.4 to 1.6 microns to top surface 19 to form 4,000 Å to 6,000 Å thick layer 11 which is planarized (e.g., flushed with filled spaces over conductive line 10). After structure 23 is polished or planarized, vias such as via 12 are formed in insulating layer 11 by a photoresist and plasma etching process or other hole forming technique.

After via 12 is formed, a glue layer (not shown) of Ti/TiN is deposited on top surface 19 of insulating layer 11. A conformal layer (not shown) of Tungsten (W) is deposited on top of the glue layer. The conformal layer fills via 12. A CMP technique having a high selectivity of the glue layer of Ti/TiN and the conformal layer of W with respect to insulating layer 11 is used to remove all the W and glue layer from top surface 19 of layer 11, thereby leaving plug 20 in via 12. Plug 20 extends from top surface 19 to bottom 15 and electrically couples line 28 to line 10. Plug 20 is flush or planarized with respect to top surface 19. After plug 20 is formed, conductive line 28 is formed similar to line 10 on top surface 19 of layer 11.

Electromigration failures typically occur on conductive line 10 proximate conductive via 18 due to large current densities associated with conductive via 18. Electromigration may create voids in conductive line 10 as metal atoms such as Al or Cu atoms or ions present in layer 14 are transported away from the proximity of conductive via 18. Additionally, the Al or Cu ions may pile up or accumulate on conductive line 10 and create shorts to adjacent conductors (not shown).

Figure 2:
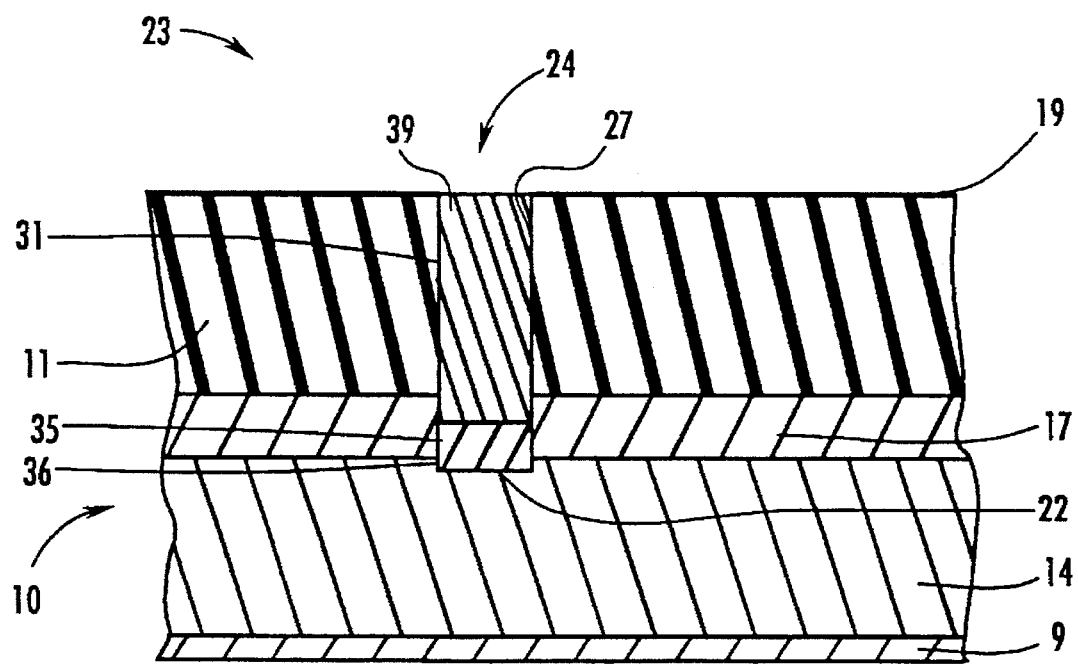
FIG. 2 is a cross-sectional view of a multilayer semiconductor structure including a barrier layer and a copper pellet in accordance with a first exemplary embodiment of the present invention.

Referring to FIG. 2, a semiconductor structure 23 is less susceptible to the harmful effects of electromigration and includes a conductive via 24. Structure 23 is similar to structure 8, wherein like designators denote like elements; however, structure 23 includes a contact, pad or reservoir such as a pellet 35 of metal having a high resistance to electromigration within a hole or via 31. Via 31 extends from a top surface 19 of insulating layer 11 to bottom 22 which is in contact with Al layer 14 of conducting line 10. Via 31 extends through barrier layer 17 to layer 14 at a depression or an indented portion 36 and is typically 0.5 microns wide.

Pellet 35 is placed in via 31 to provide a supply of metal ions for conductive via 24. Pellet 35 can be gold (Au), copper (Cu) or other metal, alloy or compound which has a high resistance to electromigration. Pellet 35 is preferably situated in via 31 so pellet 35 is in contact with conductive line 10 and physically isolated from layer 11. Pellet 35 is isolated from layer 11 to prevent diffusion of metal atoms or ions into layer 11. Via 31 preferably extends through barrier layer 17 so metal atoms from pellet 35 are transmitted directly to conductive line 10.

Conductive via 24 can include a tungsten (W), Al or other metal plug 39 deposited on top of pellet 35 within via 31. Also, barrier spacers or sidewalls (not shown) can be formed within via 31 on walls 27 of insulating layer 11. The sidewalls can further prevent diffusion of pellet 35 into layer 11.

Figure 3:
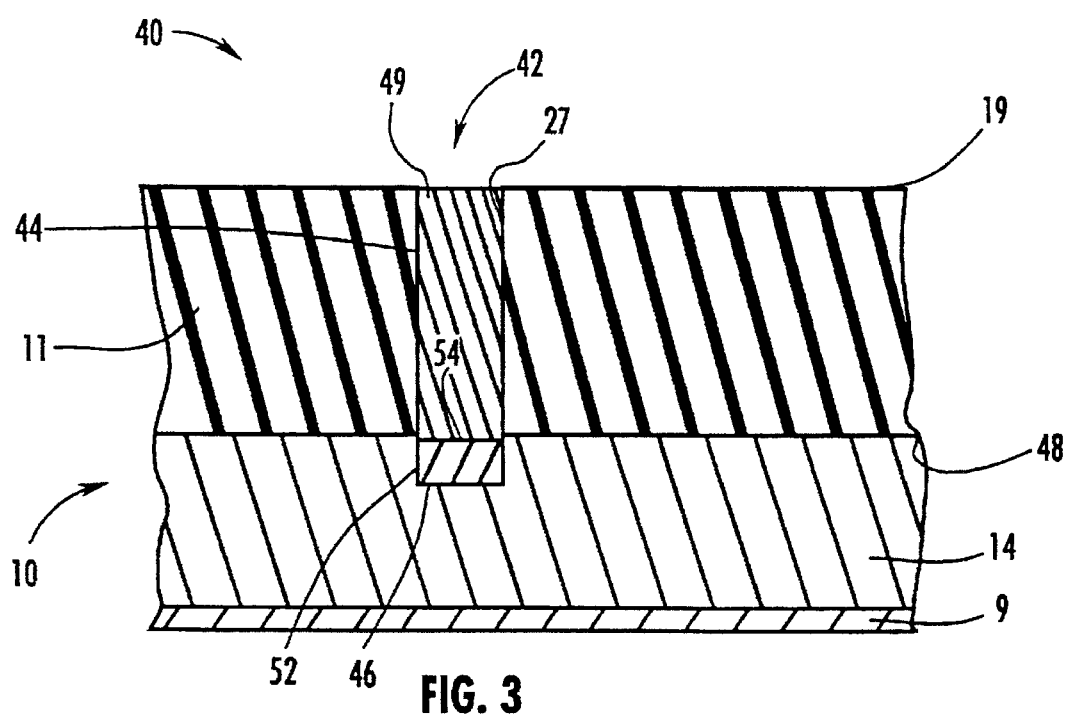
FIG. 3 is a cross-sectional view of a multi-layer semiconductor device without a barrier layer including a copper pellet in accordance with a second exemplary embodiment of the present invention.

With reference to FIG. 3, a semiconductor structure 40 includes a conductive via 42 in accordance with a second exemplary embodiment of the present invention. Structure 40 is similar to structure 23; however, structure 40 does not include barrier layer 17 (FIG. 2).

A via 44 is provided in structure 40 from top surface 19 of insulating layer 11 to a bottom 46 in contact with layer 14. Bottom 46 is preferably 300 to 700 Å below a bottom 48 of layer 11. A contact or pellet 52 is provided at bottom 46 of via 44. A top 54 of pellet 52 is located below bottom 48 so metal from pellet 52 does not diffuse into insulating layer 11. Therefore, pellet 52 is in contact with conductive line 10 and physically isolated from layer 11.

Pellet 52 is preferably isolated from layer 11 so as to prevent diffusion of metal atoms or ions into layer 11 and is made from Cu. Alternatively, pellet 52 can be Au, Cu, or alloys thereof, or a compound including any of the listed metals. A tungsten or other metal plug (not shown) can be deposited on top of pellet 52 to fill via 44 and form conductive via 42. Preferably, an Al plug 49 or plug made from a metal similar to the metal in layer 14 is deposited on top of pellet 52 to form conductive via 42. An Al plug allows Cu from pellet 52 to freely migrate through conductive via 42.

Pellet 35 (FIG. 2) and pellet 52 (FIG. 3) can be selectively deposited in vias 31 and 44, respectively, by a sputtering, CVD, collimated sputtering, dipping, evaporating, or other application technique. For example, a seed layer (not shown) of a material such as Ti can be deposited on bottom 22 of via 31. Then, metal such as Cu is deposited on top of the seed layer to form pellet 35. Alternatively, pellets 35 and 52 can be formed by directionally etching a conformal metal layer as described in more detail with reference to FIGS. 4 and 5.

Figure 4:
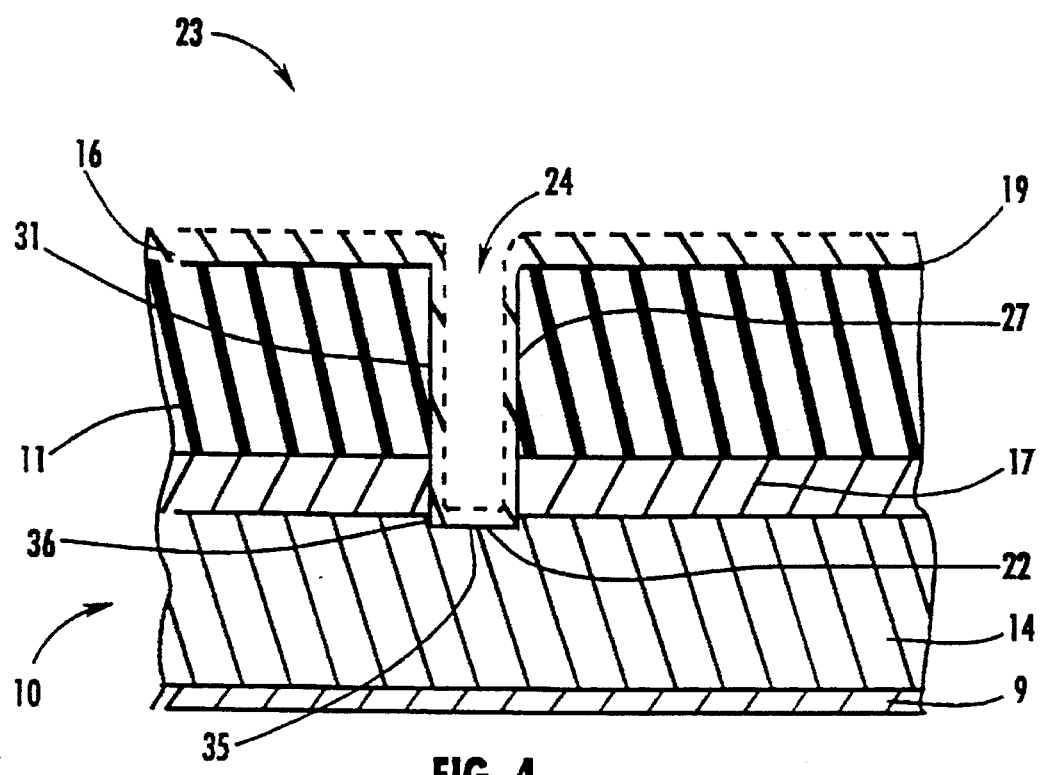
FIG. 4 is a cross-sectional view of a multilayer semiconductor device having a conformal metal layer illustrating the fabrication of the semiconductor structure shown in FIG. 2.

With reference to FIG. 4, a conformal layer 16 (shown in dashed lines) of metal having a high resistance to electromigration is deposited by a sputtering, chemical vapor deposition (CVD), collimated sputtering, dipping, evaporating, or other application technique to cover top surface 19 of insulating layer 11, bottom 22 of via 31 and walls 27 of via 31. Layer 16 is preferably 2000–4000 Å thick layer of Cu deposited by a sputtering technique.

Figure 5:
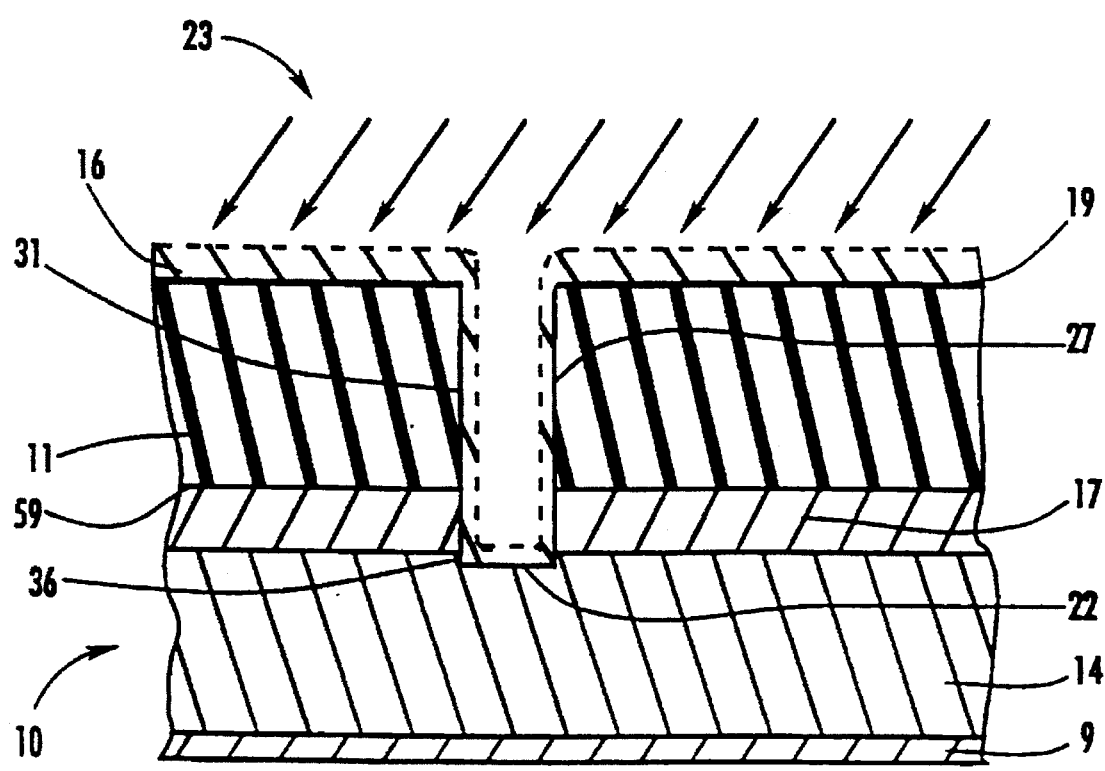
FIG. 5 is a cross-sectional view of the semiconductor device having the conformal layer directionally etched illustrating the fabrication of the semiconductor structure shown in FIG. 2 etched.

With reference to FIG. 5, conformal layer 16 is removed from top surface 19 and walls 27 of via 31, thereby leaving pellet 35 of 1000 Å thickness at bottom 22 of via 31. Portions of layer 16 are preferably removed by an anisotropic or directional dry etching process such as with a single chamber reactive ion etching apparatus or a dual chamber electron cyclotron resonance (ECR) apparatus. Semiconductor structure 23 is preferably etched at an angle of 60 degrees with respect to top surface 19. Alternatively, layer 16 can be removed from top surface 19 and walls 27 of via 31 by planarization techniques, laser ablation, CMP, wet etching or other techniques for removing portions of layer 16 and leaving pellet 35 in via 31. Layer 16 is etched so pellet 35 is physically isolated from layer 11. Generally, pellet 35 is isolated from layer 11 when the top of pellet 35 is beneath a bottom 59 of layer 11.

With reference to FIGS. 2, 4 and 5, conformal layer 16 and insulating layer 11 are removed from structure 23 to the dashed line by an etching or planarization technique, thereby removing all of metal layer 16 from top surface 19 of insulating layer 11. Preferably, pellet 35 is additionally etched below a bottom 59 of insulating layer 11 to prevent migration of metal from pellet 35 into insulating layer 11.

With pellet 35 situated below bottom 59, layer 17 advantageously prevents metal from pellet 35 from diffusing into insulating layer 11. Pellet 35 is in contact with layer 14 at bottom 22 so layer 14 can receive metal ions or atoms from pellet 35. Pellet 35 is preferably a plug or contact of Cu created for preventing failures due to electromigration.

Pellet 35 is preferably deposited by a sputter technique, chemical vapor deposition (CVD) technique, collimated sputtering technique, dipping technique, evaporating technique, or by other coating or depositing techniques. Layer 17 can be silicon nitride (SiN), titanium nitride (TiN), or other barrier for preventing metal from migrating into layer 11. Layer 11 can also be $SiO_2$, $SiO_xF_y$ (e.g., fluorinated $SiO_2$), SiON, BCB or polyimide. Layer 16 can be a Cu, or Au or alloy or compound thereof.

It is to be understood that, while the detailed drawings and specific examples given describe preferred exemplary embodiments of the present invention, they are for the purposes of illustration only. The present invention is not limited to the precise details, methods and conditions disclosed. For example, although dry etching is suggested, material may be removed in other processes. Further, although copper is suggested, other metals having high resistance to electromigration can be used. Further, the conductive vias can be rectangular or circular shaped. The dimensions, sizes, thicknesses and shapes are given in an exemplary fashion. For example, the various layers and lines may have different thicknesses and geometries, depending on integrated circuit designs and process technologies.

We claim:

1. In a multilayer semiconductor structure including a barrier layer formed over a conductive line, and an insulating layer formed over the barrier layer, the barrier layer preventing diffusion, the insulating layer having a via extending through the insulating layer and the barrier layer, the barrier layer having a top side adjacent the insulating layer and a bottom side adjacent the conductive line, the improvement comprising:

a pellet of metal having a high resistance to electromigration situated within the via at a bottom end of the via, the pellet having a top side located beneath the top side of the barrier layer and a bottom side coupled to the conductive line, the pellet being physically isolated from the insulating layer whereby the pellet reduces electromigration failures associated with the conductive line, wherein the via is filled with an aluminum plug located above the pellet.

2. The improvement of claim 1 wherein the metal includes copper.

3. The improvement of claim 1 wherein the metal includes copper, gold, or silver.

4. The improvement of claim 1 wherein the top side of the pellet is directly coupled to the aluminum plug.

5. The improvement of claim 4 wherein the bottom of pellet is connected to the conductive line.

6. The improvement of claim 1 wherein the conductive line is doped with copper.

7. The improvement of claim 6 wherein the conductive line is comprised of a 250 Angstrom thick bottom layer of titanium, and a 4000 Angstrom thick top layer of aluminum doped with copper.

8. The improvement of claim 1 wherein the conductive line is comprised of titanium, aluminum and copper, the barrier layer is titanium nitride, and the insulating layer is silicon dioxide.

9. A multilayer integrated circuit, comprising:

a metal conductive line;

a barrier layer formed over the conductive line, the barrier layer preventing diffusion;

an insulating layer formed over the barrier layer, the insulating layer having a via extending through the insulating layer and the barrier layer, the barrier layer having a top side adjacent the insulating layer and a bottom side adjacent the conductive line; and a pellet of metal having a high resistance to electromigration situated within the via at the bottom end of the via, the pellet having a top side located beneath the top side of the barrier layer and a bottom side in contact with the conductive line, the pellet being physically isolated from the insulating layer whereby the pellet reduces electromigration failures associated with the conductive line, wherein the via is filled with an aluminum plug located above the pellet.

10. The multilayer semiconductor structure of claim 9 wherein the metal includes copper.

11. The multilayer semiconductor structure of claim 9 wherein the metal includes copper, gold or silver.

12. The multilayer semiconductor structure of claim 9 wherein the via includes a barrier wall.

13. The multilayer semiconductor structure of claim 12 wherein a bottom side of the pellet is connected to the conductive line.

14. The multilayer semiconductor structure of claim 9 wherein the conductive line is doped with copper.

15. The multilayer semiconductor structure of claim 9 wherein the conductive line is comprised of titanium, aluminum and copper, the barrier layer is titanium nitride, and the insulating layer is silicon dioxide.

16. The multilayer semiconductor structure of claim 15 wherein the conductive line is comprised of a 250 Angstrom thick bottom layer of titanium and a 4000 Angstrom thick top layer of aluminum doped with copper.

* * * * *